US007002300B2

(12) United States Patent
Urban et al.

(10) Patent No.: US 7,002,300 B2
(45) Date of Patent: Feb. 21, 2006

(54) MICROWAVE GENERATOR AND METHOD OF RADIATING MICROWAVE ENERGY

(75) Inventors: Jürgen Urban, Erlangen (DE); Josef Dommer, Nürnberg (DE); Helmut Hofmann, Gräfenberg (DE); Geoffrey Staines, Röthenbach (DE)

(73) Assignee: Diehl Munitionssysteme GmbH & Co., Röthenbach (DE)

( * ) Notice: Subject to any disclaimer, the term of this patent is extended or adjusted under 35 U.S.C. 154(b) by 28 days.

(21) Appl. No.: 10/811,040

(22) Filed: Mar. 26, 2004

(65) Prior Publication Data

US 2004/0217711 A1 Nov. 4, 2004

(30) Foreign Application Priority Data

Apr. 29, 2003 (DE) ................................ 103 19 475

(51) Int. Cl.
*H01J 25/50* (2006.01)

(52) U.S. Cl. ........................ 315/39.51; 315/34; 315/44; 315/47; 307/108; 307/113; 307/115

(58) Field of Classification Search .................. 315/34, 315/36, 38, 39, 39.51, 41, 44, 47, 187; 307/106, 307/108, 113, 115; 361/120, 130; 331/101, 331/127

See application file for complete search history.

(56) References Cited

U.S. PATENT DOCUMENTS

| | | | | |
|---|---|---|---|---|
| 3,484,619 A | | 12/1969 | Proud, Jr. | 307/106 |
| 3,535,582 A | | 10/1970 | Kawiecki | 315/36 |
| 3,748,528 A | | 7/1973 | Cronson | 315/39 |
| 3,845,322 A | * | 10/1974 | Aslin | 307/108 |
| 4,430,577 A | | 2/1984 | Bouquet | 307/108 |
| 4,547,679 A | * | 10/1985 | Hansen et al. | 307/108 |
| 4,845,378 A | | 7/1989 | Garbe et al. | 307/108 |
| 5,216,695 A | * | 6/1993 | Ross et al. | 375/295 |
| 5,293,527 A | | 3/1994 | Sutton et al. | 340/825.57 |

(Continued)

FOREIGN PATENT DOCUMENTS

DE 15 91 225 9/1971

(Continued)

OTHER PUBLICATIONS

"Den Laptop im Tornister", Rustung Spiegel of Feb. 10, 1997.

*Primary Examiner*—Haissa Philogene
(74) *Attorney, Agent, or Firm*—Scully, Scott, Murphy & Presser

(57) ABSTRACT

Intensive microwave radiation in particular of great band width and energy over a relatively long period of time in the form of long pulse packets with a high pulse repetition frequency and a very high frequency spectrum can be achieved if microwave irradiation is effected during the discharge of a capacitive high-voltage generator (35) by way of the antenna (26) into a series of successive capacitors (13) to be connected in parallel. They are preferably constructed in the form of a concentric stack, connected to the antenna (26), of which the outer electrodes (16) which are at a reference potential are in the form of a continuous tube within which annular electrodes (15) are disposed on a carrier (20) in axially spaced relationship with each other in such a way that at the same time they act as the electrodes of arc switches (39) for successively switching on subsequent capacitors (13). The switch response characteristics and the charging time constants of the capacitor (13) which is respectively switched on therewith and the number thereof determine the length of the packet of high-frequency individual pulses (40) and thus the radiated microwave energy which can be still further increased by an increase in the capacitance of the capacitors (13).

7 Claims, 1 Drawing Sheet

U.S. PATENT DOCUMENTS

| | | | | |
|---|---|---|---|---|
| 5,489,818 | A * | 2/1996 | Naff et al. | 315/39 |
| 6,679,179 | B1 * | 1/2004 | Bohl et al. | 102/501 |
| 6,822,394 | B1 * | 11/2004 | Staines et al. | 315/39 |
| 2003/0076044 | A1 | 4/2003 | Staines et al. | 315/39 |
| 2004/0066117 | A1 * | 4/2004 | Staines | 310/339 |

FOREIGN PATENT DOCUMENTS

| | | | |
|---|---|---|---|
| DE | 32 16285 | C2 | 7/1986 |
| DE | 38 35 986 | C2 | 6/1991 |
| DE | 164383 | | 10/2005 |

* cited by examiner

MICROWAVE GENERATOR AND METHOD OF RADIATING MICROWAVE ENERGY

BACKGROUND OF THE INVENTION

1. Field of the Invention

The invention concerns a microwave generator which includes a radiation antenna connected to capacitors which are to be recharged, and a high-voltage generator as an energy supplier for the charging up of the capacitors. Further disclosed is a method of radiating microwave energy utilizing the inventive microwave generator.

In general terms energy is emitted in the pulse form in the microwave spectrum if a high voltage battery, for example a capacitor battery which in accordance with the principle of the Marx impulse voltage circuit is charged up in parallel and then connected in series by way of switching spark gaps is discharged by way of a spark gap. For, that involves a current flow in pulse form, which is initiated steeply and which oscillates strongly, through the capacitor circuit and through an antenna conductor which under some circumstances is connected thereto, this therefore providing for correspondingly wide-band emission of a microwave spectrum of high energy density. In the more immediate proximity that can at least impair radio communication and an electronic circuit, in particular at the input side, can be damaged or even destroyed thereby.

2. Discussion of the Prior Art

In order for microwave energy to be radiated specifically into a hollow conductor or waveguide it is known from U.S. Pat. No. 3,748,528 A for an electrode which is bottle-shaped in contour, with a cambered bottom, to be arranged to project into the waveguide in order to form a spark gap with the oppositely disposed wall region of the waveguide. The end which is opposite thereto and which in contrast is flat, so-to-speak the neck of the bottle, of that electrode projects as an electrode of a further spark gap designed as a pulse shaper, into a cavity filled with protective gas. The counterpart electrode thereof is the flat end of the inner conductor of a coaxial arrangement. That inner conductor is charged up in opposite relationship to the spark gap by means of an additional spark gap serving as a switch and by way of a pulse shaper as well as a series resistor from a high voltage dc source so that upon discharge firstly the pulse-shaping spark gap and thereafter the microwave-generating spark gap are caused to respond.

It is known for example from U.S. Pat. No. 4,845,378 A to switch over arrays of capacitors by way of spark gap switches, in the manner of the Marx impulse voltage circuit, as the high voltage source, in that case to generate an electromagnetic pulse for the simulation of a real nuclearly triggered impulse.

The effect of intensive local microwave radiation is propagated as a non-lethal weapon against enemy communication systems (see DER SPIEGEL, Issue July 1997, pages 53 if, the end of paragraph 3 of the left-hand column on page 54).

SUMMARY OF THE INVENTION

The invention is based on the technical object of providing a microwave generator and a method of radiating microwave energy which are autonomous in terms of the power supply, which can be handled without problem in terms of the apparatus dimensions and which can be optimised for different use scenarios in particular in respect of the radiation spectrum and the emitted energy density.

In accordance therewith the high voltage energy which can be obtained by means for example of a compact battery-powered Marx generator is fed at the antenna side into a sequence of capacitors which are to be successively connected in mutually parallel relationship. The parallel switching operation which occurs stepwise in succession with each other at short intervals is implemented by way of a respective spark gap as soon as the capacitor upstream thereof, in opposite relationship to the following capacitor, is charged up to the arc voltage for flashing over the spark gap towards that following capacitor. The charging operation which takes place in that situation is determined primarily by the capacitance of the capacitor which is to be freshly charged up and therefore can be structurally influenced by way of the electrode size thereof, the electrode spacing and the dielectric between the capacitor electrodes.

Therefore, while recharging from the capacitive high voltage generator is still taking place, the sequence of flashovers begins for charging the respective following capacitors, with the charging current which is still fed in by way of the antenna and parallel thereto from the respective capacitor charged up upstream of the currently responding arc gap. Such a flashover switching operation for charging up the next following capacitor triggers a steep current edge which is infraposed in high-frequency relationship, in the charging current by way of the antenna, wherein a part of the energy from the new arc flows back in opposite relationship to the feed and thus towards the radiation antenna in the form of microwave energy to be irradiated, while the other part by way of the arc gap contributes to charging up the next following capacitor—until the subsequence spark gap in turn responds; and so forth. The number of microwave pulses which occur in succession in an irradiated pulse packet is therefore equal to the number of switching gaps in the successive capacitors which are to be connected in mutually parallel relationship.

Depending on the respective mechanical design of the system, when using a gaseous dielectric, the pulses in the pulse packet involve a repetition frequency of the order of magnitude of typically 150 MHz with a radiation spectrum around 100 MHz for each switching section, which, in the case for example of six switching sections, is superimposed to afford an irradiation microwave spectrum of around 600 MHz. The microwave spectrum can therefore be structurally influenced within wide limits in terms of noise length (that is to say the number of pulses in the pulse packet) and spectral content, by way of the mechanical design configuration of the microwave generator, in particular in respect of its capacitors which are to be mutually successively connected in parallel.

The structural configuration of a microwave generator on the functional basis of pulse sequence production by way of a capacitor chain which is to be switched on in time-staggered relationship while charging thereof from the high voltage generator is still occurring preferably comprises a number of successively arranged capacitor electrodes which are geometrically designed as a succession of spark gaps while their respective mutually opposite capacitor electrodes are connected together. The mutual spacings between the ends of the spark gaps are ensured by spacers which are disposed in parallel relationship therewith. The first one of that sequence of capacitors, which is to be charged up from the high voltage generator, is electrically conductively connected at its spark gap electrode to the radiation antenna. It is preferably in the form of a frustoconical conductor for impedance matching purposes. The high voltage feed into the capacitor chain is desirably effected not upon the connection between the radiation antenna and the first spark gap, but by way of the radiation antenna so that the vigorous current oscillation which is triggered by the arc switching procedure is also already involved at that feed for microwave irradiation.

DETAILED DESCRIPTION OF THE INVENTION

Figure 2:
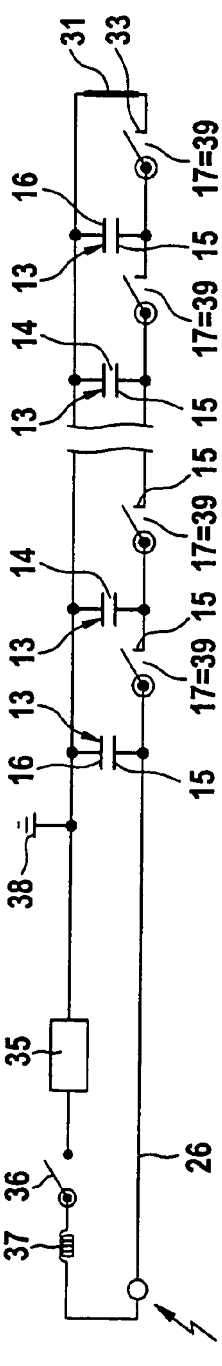
FIG. 2 shows the electrical equivalent diagram of the arrangement shown in FIG. 1, locally associated with the mechanical structure.
Figure 1:
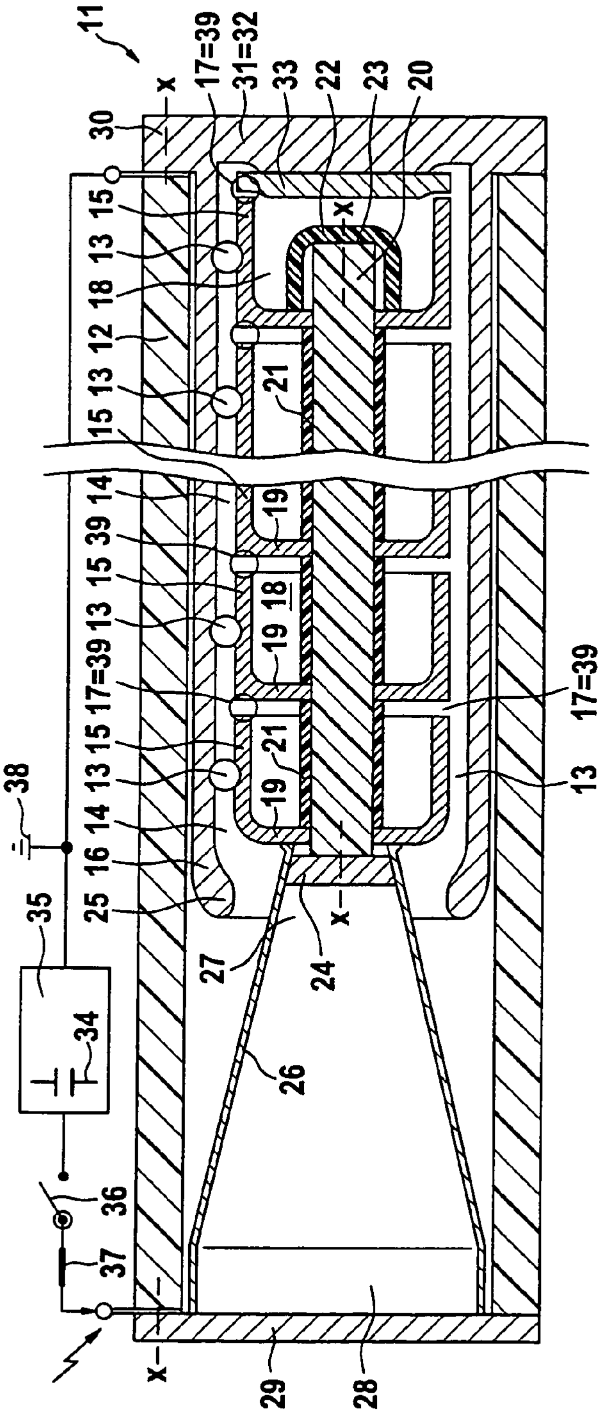
FIG. 1 is an interrupted axial longitudinal section behind a radiation antenna showing a coaxial stack of arc switching sections which at the same time are electrodes of successive capacitors which are to be connected in mutually parallel relationship.

The microwave generator 11 which is of a coaxial design structure and which is diagrammatically illustrated in FIG. 1 in the interrupted axial longitudinal section substantially comprises a tubular housing 12 of high voltage-resistant insulating material, within which is arranged an axial stack of hollow-cylindrical capacitors 13. They have annular electrodes 15, 16 on both sides of their dielectric 14 which is effective as a capacitance and with which the entire housing 12 is filled. The annular inner electrodes 15—15 of the capacitors 13 are each spaced from each other by way of a respective internal axial spacing 17 in the column-shaped stack. Their outer or counterpart electrodes 16, as can be seen from FIG. 2, are electrically connected in parallel with each other and therefore, as shown in FIG. 1, are structurally designed in one piece as a tube coaxially surrounding the electrode stack 15—15. However, it is also possible to implement the opposite structure (that is to say outwardly disposed switched electrodes 15, with an inwardly disposed counterpart electrode 16 which extends through the arrangement in bar form).

For the situation shown by way of example in FIG. 1 therefore, a counterpart electrode 16 which is tubular throughout for all capacitors 13 extends coaxially along the inside wall of the housing 12, over the axial stack of mutually axially spaced annular inner electrodes 15.

In order to be able to easily mount the annular electrodes 15 in the interior of the housing, they are in the form of the hollow-cylindrical walls of a respective cup 18 having a centrally apertured bottom 19. A carrier 20 in the form of a round bar and which is common to all such cups 18 and which comprises high voltage-resistant material passes without play through the centrally apertured bottom 19 of the cups. The axial spacings 17 between the annular electrodes 15 or between the cup bottoms 19 thereof are determined in accordance with the axial electrode lengths by the lengths of sleeve-shaped spacer elements 21 of high voltage-resistant insulating material, which are also held on the insulating material carrier 20 between the axially successive bottoms 19. An end cap 28 which is screwed on from the free end 23 of the carrier 20 provides that the axial stack of cup bottoms 19 and spacer elements 21 disposed between them is braced axially against each other and against a support 24 at the opposite end of the carrier 20. In that axially opposite region, the counterpart electrode 16 which surrounds the stack in a tubular configuration terminates with a curved collar 25 which approximately follows the field line configuration in the interests of high voltage flashover resistance.

A radiation antenna 26 which in the interests of impedance matching is of a frustoconical shape or as diagrammatically illustrated a hollow frustoconical shape is radially centred at its smaller base by the carrier 20 which here axially engages therein or by the support 24 provided thereon and at the same time is electrically connected to the electrode cups 18 and thus to the first spark gap 17 by axially bearing against the first bottom 19 of the stack of electrode cups. At the opposite end, that is to say in the region of its large base 28, the frustoconical antenna 26 is positioned radially at the inside peripheral surface of the housing 12 and axially clamped in position by a cover 29 which is fixed in front of the housing 12.

For holding the tubular counterpart electrode 16 in the housing 12, provided in axially opposite relationship is a flange 30 which, as diagrammatically illustrated, can be formed in one piece with the counterpart electrode 16 and which then serves at the same time as the housing end portion 31 and as a connecting conductor 32 to a disc-shaped terminating electrode 33 in front of the free end edge of the last, which is in opposite relationship to the antenna connection, of the annular electrodes 15.

For operation of that microwave generator 11 the capacitor array 34 of a for example battery-powered compact Marx high-voltage generator 35 is applied by way of an operating switch 36 (preferably in the form of a self-firing or externally triggered spark gap) and the inductance 37 of the feed line to the electrically conducting structure of the radiation antenna 26. A charging current flows by way thereof into the first of the capacitors 13 until its internal electrode 15, in relation to the counterpart electrode 16 which is at earth potential and in particular in relation to the annular electrode 15 of the next following capacitor which is still uncharged at the initial potential, is charged up to a voltage which causes arcing through the spacing 17 in relation to the axially next following annular electrode 15. The internal axial spacing 17 therefore serves as an arc switch for commencing charging of the subsequent one of the capacitors 13—13, such commencement being delayed in accordance with the charging time constant of the preceding capacitor 13.

That successive response on the part of the arc switches 39 is also effected during the recharging process from the high-voltage generator 35 into the stack of capacitors 13—13 and thus results, in respect of amplitude and frequency, in extreme oscillations of the charging current by way of the antenna 26, which oscillations are radiated in the form of pulse packets of microwave energy. Added to that is the fact that, by virtue of the characteristic wave impedance adaptation at the arc from the annular electrode 15 of the capacitor 13 which is just being charged, to the annular electrode 15 of the next following capacitor 13 which is now to be charged by way of the switch 39, in respect of energy balance sheet and direction of propagation, a division occurs such that a part of the energy at the arc section of the switch 39 is reflected back towards the radiation antenna 26, which increases the energy balance sheet of the microwave radiation by way of the antenna 26, while the remainder of the energy, by way of the arc of the switch 39, results in charging of the next following capacitor 13 from the previously charged capacitor, supplemented by the charging current which is still occurring from the high-voltage generator 35. If in that way, from its annular electrode 15 to that of the next following capacitor 13, a sufficient potential difference is built up across the gap of the next following switch 39, an arc is also fired there, and once again the above-described oscillations occur, with splitting of the energy into a component which leads to the next capacitor 13 and a component of preferably equal size, which reflects back to the radiation antenna 26 by way of the spark gaps, which are still present, of the previously already closed switches 39, and so forth. The last of that stack of parallel-connected capacitors 13 is then only still short-circuited by way of the arc of its switch 39 and the terminating electrode 33, which however once again triggers vigorous oscillations of large amplitude and thus again a contribution to the microwave radiation.

Figure 3:
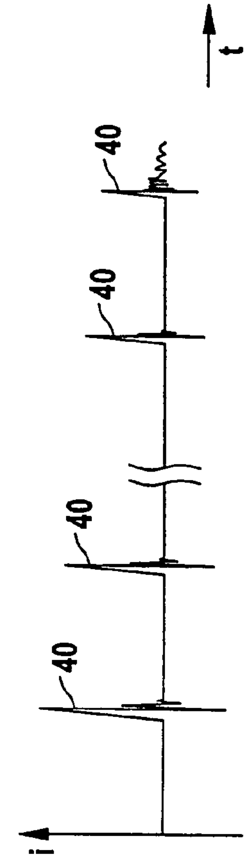
FIG. 3 shows a pulse-time diagram on a greatly coarsened scale in terms of its spectral content, in association with the mechanical structure shown in FIG. 1.

Thus the rapid temporal succession of the charging processes by way of the stack of capacitors 13—13 during discharging of the high-voltage generator 35 by way of the antenna 26 into that capacitor stack 13—13 gives rise to a pulse packet which is diagrammatically shown in FIG. 3 in relation to time, comprising a rapid succession of respective short-term, very vigorously oscillating pulses 40. The height thereof and the frequency spectrum contained therein can be varied by the capacitances of the capacitors 13 which do not have to be the same as each other, that is to say in particular by the radial spacing between the electrodes 15–16, by the magnitude of the mutually opposite electrode surfaces (15 in opposite relationship to 16) and by the dielectric between the two, but it can also be influenced by the response characteristics of the arc switches 39, such characteristics being determined by the electrode shape and spacing. The time interval between two pulses 40 is also influenced by the capacitances 13, but it is crucially determined by the system inductance 37 in the charging circuit to the capacitances 13. The number of successive pulses and thus the length in respect of time of the pulse packet of the microwave radiation can be varied by the number of electrodes 15 which are disposed one in front of the other.

In comparison with conventional coaxial single-pulse antennae, the rapid succession of the pulses 40 results in an increase in the centre frequency of the irradiated spectrum. The pulse spacing in the pulse packet and the frequency spectrum radiated therefrom can be influenced by way of the length of the connected annular electrodes 15 and the arc response characteristics thereof. A typical design with six spark gap switches 39 has a response succession of 10 ns, which is determined by the charging inductance 37, and in the pulse packet 40 carries a frequency mix of around 600 MHz, which is determined by the capacitances 13. When the microwave generator 11 is designed for a lower radiation frequency spectrum the irradiated energy is increased. Moreover the irradiated energy is increased with the square of the high-voltage charging voltage from the generator 35 and with the antenna capacitance. That is proportional to the dielectric constant in the housing 12. That therefore affords a perceptible increase in power, at a reduced spectrum, if instead of being filled with gas, the housing 12 is filled with an insulating substance having a higher dielectric constant, such as in particular distilled water or oil.

Thus, in accordance with the invention, intensive microwave radiation in particular of great band width and energy over a relatively long period of time can be achieved if microwave irradiation is not effected upon discharge of previously charged capacitors by way of the antenna, but during the discharge of the capacitive high-voltage generator 35 by way of the antenna 26 into a series of successive capacitors 13 to be connected in parallel. They are preferably constructed in the form of a concentric stack, connected to the antenna 26, of which the outer electrodes 16 which are at a reference potential are in the form of a continuous tube within which annular electrodes 15 are disposed on a carrier 20 in axially spaced relationship with each other in such a way that at the same time they act as the electrodes of arc switches 39 for successively switching on subsequent capacitors 13. The switch response characteristics and the charging time constants of the capacitor 13 which is respectively switched on therewith and the number thereof determine the length of the packet of very high-frequency individual pulses 40 and thus the radiated microwave energy which can be still further increased by an increase in the capacitance of the capacitors 13.

What is claimed is:

1. A microwave generator (11) with a radiation antenna (26) which is connected to capacitors (13) which are to be recharged, and a high-voltage generator (35) comprising an energy supplier for charging up the capacitors (13), wherein the high-voltage generator (35) is connected through the radiation antenna (26) to a coaxial succession of annular capacitors (13) which are sequentially connectable in parallel with each other, said capacitors (13) possessing first and second electrodes (15, 16), each capacitor having a respective tubular said second counterpart electrode (16) connected together with the other electrode (16) while the first electrode (15) is connectable by a switch (39) to the most closely adjacent further electrodes (15), and wherein disposed in the interior of a respective tubular said second electrode (16) are a number of axially mutually spaced annular said first electrodes (15).

2. A microwave generator according to claim 1, wherein the spacings (17) between the annular electrodes (15) and the end profiles thereof are in the form of arc switches (39).

3. A microwave generator according to claim 1, wherein the capacitor (13) which is located remotest from the energy infeed has an arc switch (39) in relation to a terminating electrode (33) which is at the potential of the respective counterpart electrode (16).

4. A microwave generator according to claim 1 wherein the annular first electrodes (15) are of a cup-shaped configuration with a centrally apertured bottom (19) through which said electrodes are arranged in a row on a carrier (20).

5. A microwave generator according to claim 4, wherein spacer elements (21) are arranged on the carrier (20) between the cup bottoms (19).

6. A microwave generator according to claim 5, wherein the cup-shaped electrodes (15) are braced axially on the carrier (20) by the provision of an end cap (22) and the spacer elements (21) between said cup bottoms (19).

7. A microwave generator according to claim 4, wherein a frustoconical radiation antenna (26) is centered by the carrier (20) and is electrically connected with the smaller base (27) thereof to the first capacitor (13) located adjacent thereto on the carrier (20).

* * * * *